United States Patent
Evans et al.

(10) Patent No.: US 7,714,354 B2
(45) Date of Patent: May 11, 2010

(54) ELECTROFORMED METAL STRUCTURE

(75) Inventors: David R. Evans, Beaverton, OR (US);
John W. Hartzell, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 80 days.

(21) Appl. No.: 11/978,909

(22) Filed: Oct. 30, 2007

(65) Prior Publication Data

US 2008/0054469 A1  Mar. 6, 2008

Related U.S. Application Data

(62) Division of application No. 10/871,938, filed on Jun. 17, 2004, now Pat. No. 7,306,962.

(51) Int. Cl.
*H01L 29/80* (2006.01)

(52) U.S. Cl. ............... 257/159; 257/E21.174; 257/E21.295; 257/E21.477; 257/E21.479

(58) Field of Classification Search .......... 257/E21.159, 257/21.174, 21.295, 21.477, 21.479
See application file for complete search history.

(56) References Cited

U.S. PATENT DOCUMENTS

| | | | | |
|---|---|---|---|---|
| 6,613,663 B2 * | 9/2003 | Furuya | ............... | 438/613 |
| 6,624,060 B2 * | 9/2003 | Chen et al. | ............... | 438/613 |
| 6,740,577 B2 * | 5/2004 | Jin et al. | ............... | 438/612 |
| 6,753,254 B2 * | 6/2004 | Sandhu et al. | ............... | 438/678 |
| 2003/0060041 A1 * | 3/2003 | Datta et al. | ............... | 438/652 |

* cited by examiner

*Primary Examiner*—Howard Weiss
*Assistant Examiner*—Steven H Rao
(74) *Attorney, Agent, or Firm*—Law Office of Gerald Maliszewski; Gerald Maliszewski

(57) ABSTRACT

A method is provided for electroforming metal integrated circuit structures. The method comprises: forming an opening such as a via or line through an interlevel insulator, exposing a substrate surface; forming a base layer overlying the interlevel insulator and substrate surface; forming a strike layer overlying the base layer; forming a top layer overlying the strike layer; selectively etching to remove the top layer overlying the substrate surface, exposing a strike layer surface; and, electroforming a metal structure overlying the strike layer surface. The electroformed metal structure is deposited using an electroplating or electroless deposition process. Typically, the metal is Cu, Au, Ir, Ru, Rh, Pd, Os, Pt, or Ag. The base, strike, and top layers can be deposited using physical vapor deposition (PVD), evaporation, reactive sputtering, or metal organic chemical vapor deposition (MOCVD).

7 Claims, 4 Drawing Sheets

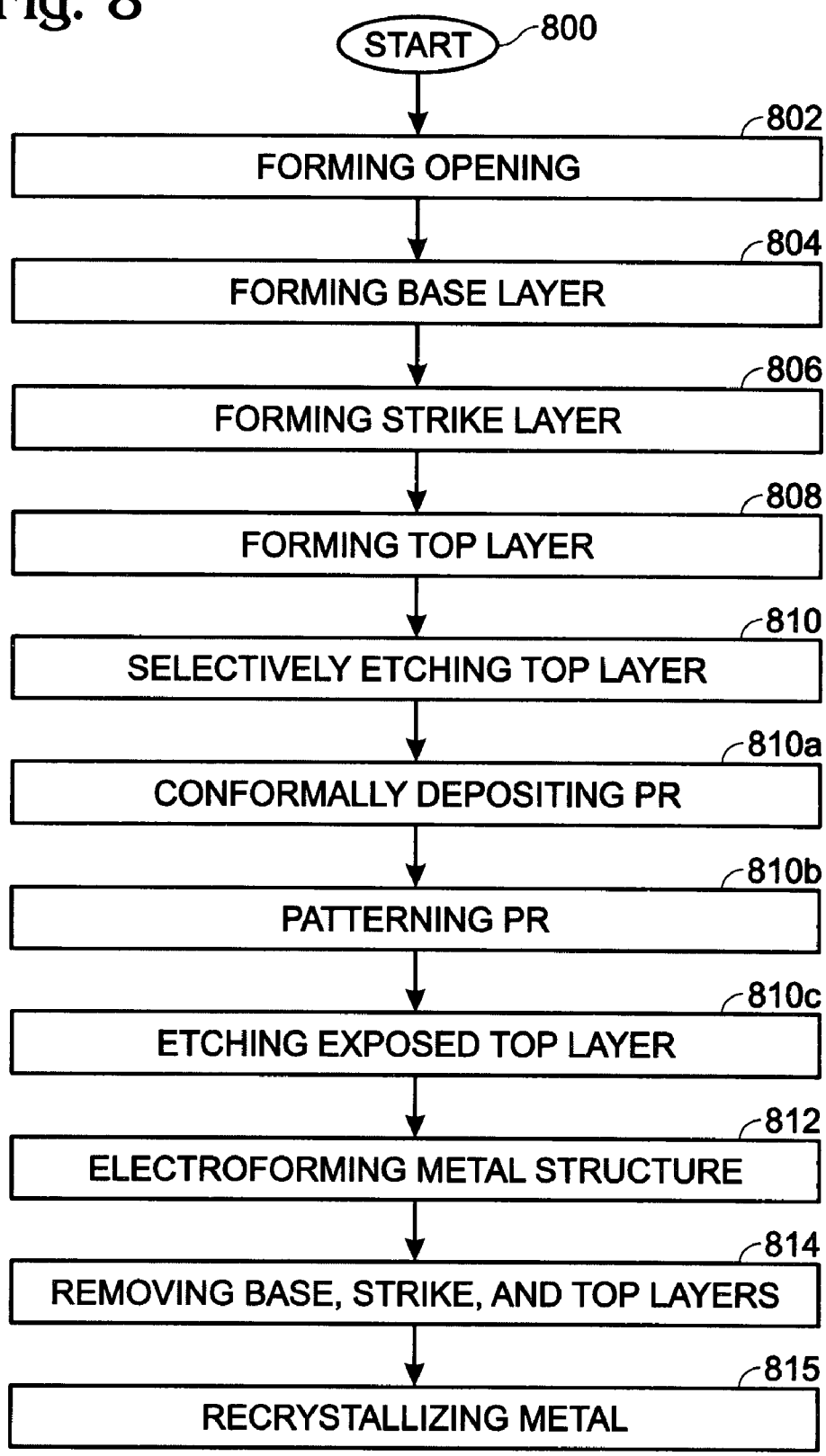

ELECTROFORMED METAL STRUCTURE

RELATED APPLICATIONS

This application is a Divisional Application of a pending patent application entitled, ELECTROFORMED METALLIZATION, invented by Evans et al., Ser. No. 10/871,938, filed Jun. 17, 2004, now U.S. Pat. No. 7,306,962 which is incorporated herein by reference.

BACKGROUND OF THE INVENTION

1. Field of the Invention

This invention generally relates to integrated circuit (IC) and liquid crystal display (LCD) fabrication and, more particularly, to a method for electroforming metal wiring and related structures.

2. Description of the Related Art

In current integrated circuit and display applications, physical vapor deposition (PVD) aluminum/copper/silicon alloys are used to form interconnects and electrically conductive wires (traces) on the various circuit layers. Generally, these wires are formed on a scale of magnitude in the region of 1 to 1000 microns. These wires are patterned subtractively, by etching a conformal deposition of metal through a photoresist mask. Alternatively, copper damascene process is used, which forms a patterned trench structure, fills the trench with metal, and polishes excess metal deposited overlying the trench. However, these subtractive processes limit the shapes into which the resultant metal structures can be formed. For example, it is difficult to form a metal structure that is re-entrant or one with an intentional overhang; a structure where the top cross-sectional area is greater than the bottom cross-sectional area.

On a vastly different scale, on the order of a millimeter, printer circuit board (PCB) processes form multi-layered boards with electrically conductive metal wires. Issues of chemical compatibility, substrate material consistency, and the rigorous exclusion of contamination prevent the direct scaling of PCB metallization technology to ICs, displays, and advanced multi-chip modules (MCMs). The larger size of PCBs permits macroscopic processes such as direct printing and pattern transfer to be used. However, these macroscopic processes cannot be used for ICs and LCDs due to the severe dimensional tolerances involved.

The deposition of metals on large IC substrates requires the use large chamber, expensive/complicated atmosphere and temperature control equipment. Often the IC and LCD processes require the use of vacuum chambers. PCB processes, on the other hand, require less sophisticated equipment, such as baths and plating devices.

Advantageously, the successive use of PCB additive deposition processes permits the easy formation of microscopic metal structures containing enclosures. These enclosure structures can be filled with a second material such as an insulator, which then might form a coaxial transmission line or other such structure. These structures cannot be obtained easily using conventional subtractive technology, since a re-entrant structure must be formed, in order to close off the inner volume.

It would be advantageous if IC and LCD metal structures could be formed using an additive deposition process.

It would be advantageous if conventional PCB electroplating processes could be adapted to IC and LCD processes, to provide a low cost, low thermal budget solution for metal deposition.

It would be advantageous if electroless deposition processes could be adapted to IC and LCD processes.

SUMMARY OF THE INVENTION

The present invention describes a strictly additive patterning method that deposits metal only in the open patterned areas of an IC substrate, and not in field regions. The additive patterning results from the deposition of metal using electroplating and electroless deposition techniques.

Accordingly, a method is provided for electroforming metal integrated circuit structures. The method comprises: forming an opening such as a via or line through an interlevel insulator, exposing a substrate surface; forming a base layer overlying the interlevel insulator and substrate surface; forming a strike layer overlying the base layer; forming a top layer overlying the strike layer; selectively etching to remove the top layer overlying the substrate surface, exposing a strike layer surface; and, electroforming a metal structure overlying the strike layer surface. The electroformed metal structure is deposited using an electroplating or electroless deposition process. Typically, the metal is Cu, Au, Ir, Ru, Rh, Pd, Os, Pt, or Ag.

The base, strike, and top layers can be deposited using physical vapor deposition (PVD), evaporation, reactive sputtering, or metal organic chemical vapor deposition (MOCVD). The base layer can be a material such as W, Ta, Ti, Zr, Mo, or Cr, to name a few examples. The strike layer can be Pd, Pt, Ir, Rh, Ru, Os, Ag, Au, Cu, Ni, or Cr, for example. The top layer can be a refractory metal.

Additional details of the above-described method are provided below.

BRIEF DESCRIPTION OF THE DRAWINGS

FIG. 8 is a flowchart illustrating the present invention method for electroforming metal integrated circuit structures.

DETAILED DESCRIPTION OF THE PREFERRED EMBODIMENTS

Figure 1:
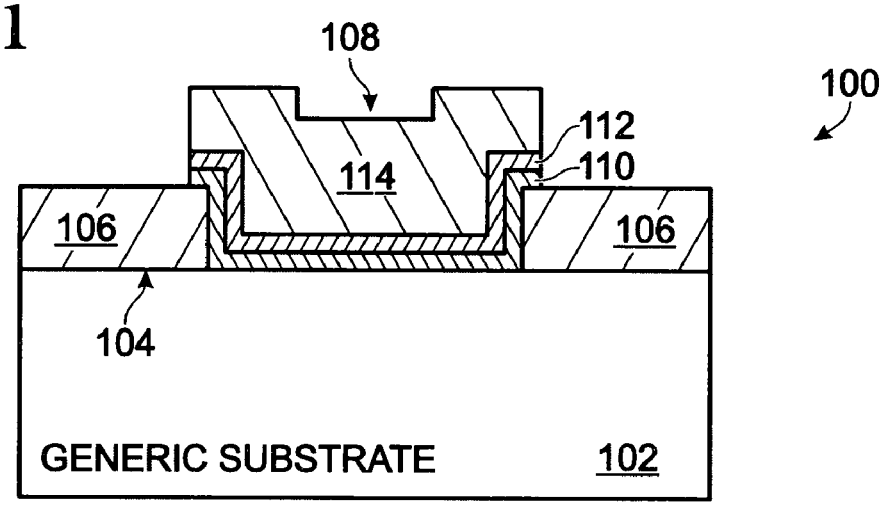
FIG. 1 is a partial cross-sectional view of the present invention electroformed metal structure.

FIG. 1 is a partial cross-sectional view of the present invention electroformed metal structure. The structure 100 comprises a substrate 102 with a surface 104. The substrate 102 can be a material such as silicon, glass, ceramic, or plastic. An interlevel insulator 106 overlies the substrate 102, with an opening 108 exposing the substrate surface 104. The opening 108 can be seen more clearly in FIG. 2. The interlevel insulator 106 can be a conventional oxide or nitride for example. A base layer 110 overlies the substrate surface 104. The base layer 110 can be a refractory metal such as W, Ta, Ti, Zr, Mo, Cr, refractory metal nitrides and carbides, mixed nitride-carbides, or mixed nitride-silicides.

A strike layer 112 overlies the base layer 110. The strike layer 112 can be a material such as Pd, Pt, Ir, Rh, Ru, Os, Ag, Au, Cu, Ni, Cr, or alloys of the above-mentioned materials. An electroformed metal structure 114 overlies the strike layer surface 112. The metal structure 114 is a metal such as Cu, Au, Ir, Ru, Rh, Pd, Os, Pt, or Ag. The metal structure 114 can be a line, via, bonding pad, electrode, contact hole, or interlevel interconnect. As explained in more detailed below, a temporary top layer (not shown in this figure), made from a material such as refractory metals, refractory metal nitrides, or mixed nitride-silicides, overlies the strike layer 112 as a step in the fabrication process.

Functional Description

Figure 2:
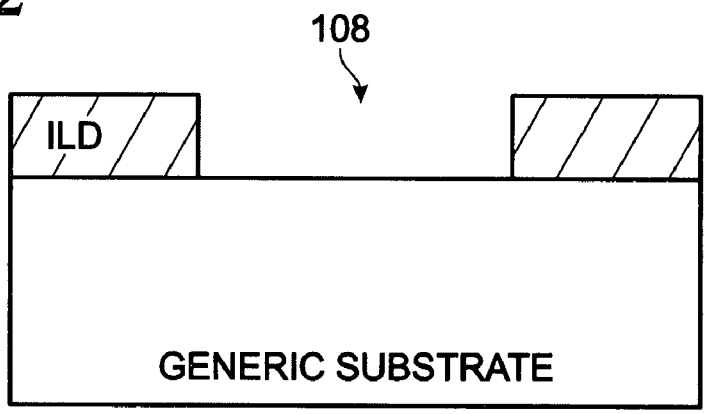
FIGS. 2 through 7 illustrate steps in the fabrication of the present invention electroformed metal structure.

FIGS. 2 through 7 illustrate steps in the fabrication of the present invention electroformed metal structure. The process begins with open contact holes, or equivalent structures, prepared for metallization formation. A representative cross-section is shown in FIG. 2. The contact holes are made through some suitable insulating material (ILD), and the generic substrate may be silicon, glass, ceramic, plastic, or some other material or combination of materials. In addition, electronic, electromechanical, or other types of devices and/or structures may be already formed in the substrate. In this case, the purpose of the metallization is to provide electrical connections between such devices or structures. For example, the opening through the ILD may expose an electrode, and the present invention metal structure is deposited to contact the electrode.

Figure 3:
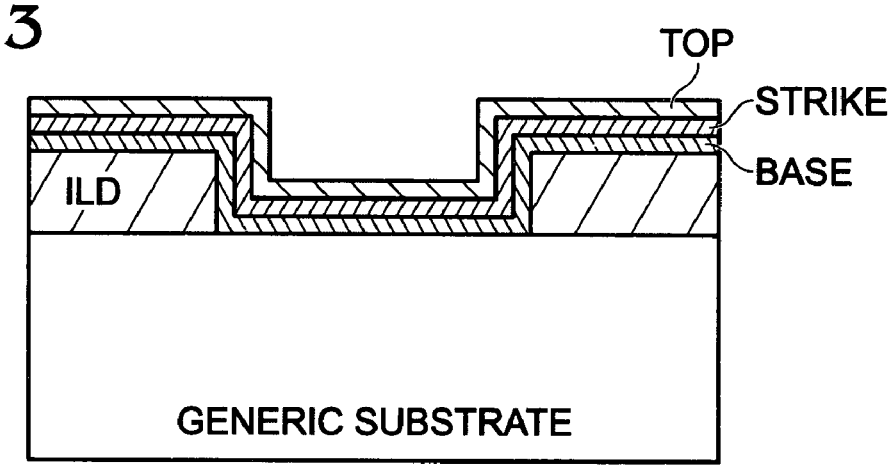

This step is followed by the sequential deposition of three metal layers by PVD, evaporation, MOCVD, or other suitable deposition technique, as shown in FIG. 3. These depositions may be done in the same equipment or using different equipment, as is appropriate. The base layer provides a barrier to interdiffusion as well as strong adhesion between the metallization and the substrate. Typically, the base layer is a refractory metal such as W, Ta, Ti, or alloys thereof, and corresponding nitrides or mixed nitride-silicides. The strike layer provides a surface for subsequent electrodeposition. Typically, the strike layer is a noble or semi-noble metal such as Pd, Pt, Ir, Rh, Ru, Os, Ag, Au, Cu, Ni, Cr, or alloys thereof. The top layer provides a surface for photoresist adhesion, because metals that provide a good surface for electroplating typically do not provide a good surface for resist adhesion. Candidate materials for this layer are the same as for the base layer, although the base and top layers do not need to have the same composition.

Figure 4:
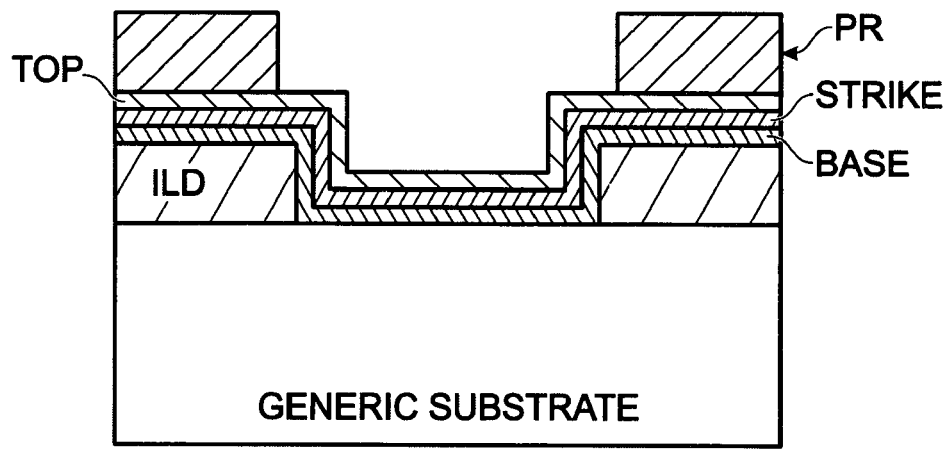

Next, a photoresist (PR) image of the completed metal structure is patterned on the substrate using conventional photolithography. This is shown in FIG. 4.

Figure 5:
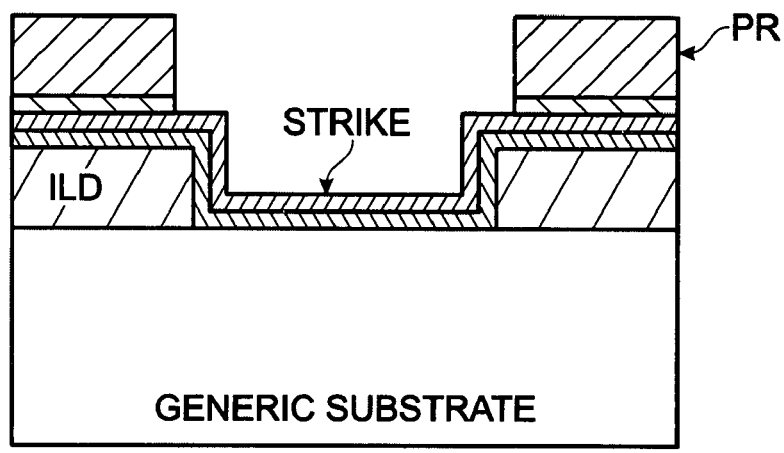

Using photoresist as a mask, the top layer is chemically etched away in the open area to expose the strike layer, see FIG. 5. A typical etchant used for this purpose is hydrogen peroxide, although the selection of etchant is dependant upon the exact composition of the top layer. For alternative materials, various mineral acids or other chemical solutions can be used, provided that they do not substantially attack or remove the photoresist. In addition, the photoresist might be made more chemical resistant using known techniques such as baking at high temperature or ultraviolet hardening.

Figure 6:
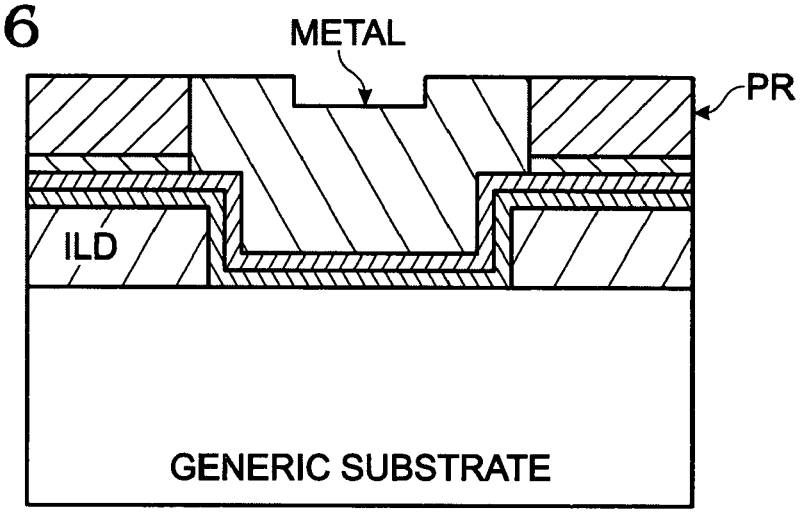

FIG. 6 depicts the deposition of electroformed metal. Copper or other suitable conductor metal, such as Au or Ag for example, is electroplated. Deposition occurs only in the open feature and not on top of the photoresist since the resist is insulating and no electrical current can flow through the resist layer. This manner of metal deposition is "electroforming". Alternatively, electroless deposition can be used. The substrate configuration remains the same since electroless deposition requires a conductive surface. Hence, metal is deposited only in open areas of the pattern and not on photoresist.

As used herein, "electroplating" is a process that deposits metal from a chemical solution by the intentional application of an electrical current. Current is applied to a substrate and metal is deposited in the areas of the substrate that conduct current. As used herein, electroless deposition is a process that deposits metal from a chemical solution using an oxidation-reduction chemical reaction catalyzed by a metal surface pre-existing on the substrate. That is, metal is deposited on the metal surfaces of the substrate in response to a chemical reaction.

As used herein "electroforming" is either an electroplating or electroless deposition process that forms complex shapes directly on a pre-formed template of photoresist or some other material. Electroforming is not a conformal deposition process that isotropically deposits metal over the entire surface of the substrate.

Figure 7:
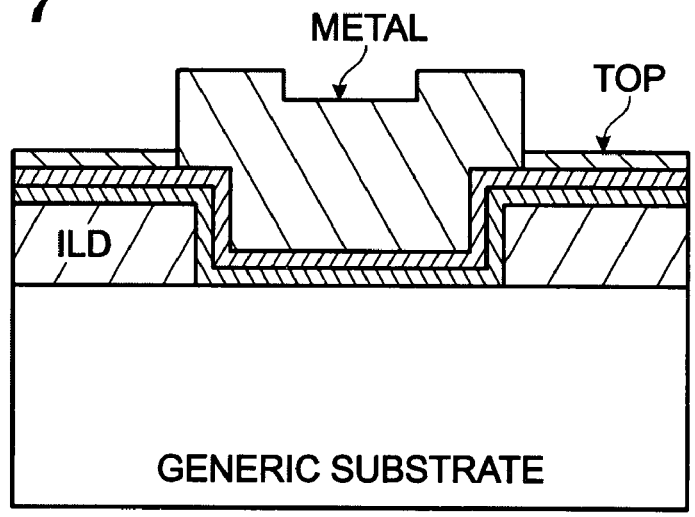

FIG. 7 depicts the electroformed metal structure following the removal of photoresist. The photoresist is removed taking care not to damage the electroformed metal. This means that any hardening or other chemical modification of the photoresist should not substantially interfere with or impede resist removal. That is, a removal technique, such as plasma ashing at high temperature, should not be used as it damages the metallization.

Returning to FIG. 1, the completed electroformed metal structure is shown. The structure is completed by removal of base, strike, and top layers in the field region using the electroformed metal structure as a mask. Wet chemical etching or dry etching may be used for this purpose. Again, any applicable removal chemistry must not damage the electroformed metallization.

Further heat treatments may be performed to stabilize or recrystallize the metal at this point. However, this step is not essential to the invention. This heat treatment may also have as its primary purpose the improvement of device properties or other characteristics not directly associated with the interconnect structure.

Upon completion, the single layer of interconnect, such as the structure shown in FIG. 1, may be used as a starting substrate, i.e., as the generic substrate. Then, a dielectric material can be applied by CVD, spin-coating, or some other applicable process. Contact holes or vias can be patterned by conventional photolithography and cut through the dielectric layer by chemical etching to expose the electroformed interconnect at desired locations. The entire electroformation process can be repeated as described in FIGS. 1 through 7, thus, fabricating a two-level interconnect.

The electroformation process can be repeated an arbitrary number of times, to fabricate a multi-level interconnect. As in conventional etched aluminum IC interconnect schemes, chemical mechanical polishing of the interlevel dielectric material can be used if required, to reduce topography and enhance photolithographic resolution. However, this step is not essential to the invention.

FIG. 8 is a flowchart illustrating the present invention method for electroforming metal integrated circuit structures. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 800. Step 802 forms an opening through a first interlevel insulator, exposing a substrate surface. The substrate surface exposed in Step 802 may be silicon, glass, ceramic, or plastic. Step 804 forms a base layer overlying the first interlevel insulator and substrate surface. Step 806 forms a strike layer overlying the base layer. Step 808 forms a top layer overlying the strike layer. Step 810 selectively etches to remove the top layer overlying the substrate surface, exposing a strike layer surface. Step 812 electroforms a first metal structure overlying the strike layer surface.

Electroforming a first metal structure overlying the strike layer surface in Step 812 includes depositing metal using either a electroplating or electroless deposition process. Step 812 deposits a metal such as Cu, Au, Ir, Ru, Rh, Pd, Os, Pt, or Ag. The structure formed in Step 812 may be a line (conductive trace), via, bonding pad, electrode, contact hole, or interlevel interconnect.

Step 814 removes the base, strike, and top layers overlying the first interlevel insulator, adjacent the first metal structure (in the field regions). Step 814 may use the metal structure deposited in Step 812 as a mask. Step 816 conformally deposits a second interlevel insulator. Step 818 forms an opening through the second interlevel insulator, exposing a first metal structure surface. Because of the similarity between Steps 802 through 812, and Steps 818 through 828, Steps 816-828 are not shown. Step 820 (see Step 804) forms a base layer overlying the second interlevel insulator and first metal structure surface. Step 822 (806) forms a strike layer overlying the base layer. Step 824 (808) forms a top layer overlying the strike layer. Step 826 (810) selectively etches to remove the top layer overlying the first metal structure surface, exposing a strike layer surface. Step 828 (812) electroforms a second metal structure overlying the strike layer surface.

In some aspects of the method a further step, Step 815 recrystallizes the first metal structure using a heating procedure as described above. Likewise the second metal structure can be recrystallized following Step 828.

In another aspect, forming a base layer (Step 804), forming a strike layer (Step 806), and forming a top layer (Step 808) includes depositing base, strike, and top layer materials using a process such as PVD, evaporation, reactive sputtering, or MOCVD. Note, the three steps need not necessarily use the same process. In fact, a different type of deposition may be used for each step of deposition.

Forming a base layer overlying the first interlevel insulator and substrate surface in Step 804 includes forming a base layer from a refractory metals such as W, Ta, Ti, Zr, Mo, Cr, refractory metal nitrides and carbides, mixed (refractory metal) nitride-carbides, or mixed nitride-silicides.

Forming a strike layer overlying the base layer in Step 806 includes forming a strike layer from a material such as Pd, Pt, Ir, Rh, Ru, Os, Ag, Au, Cu, Ni, Cr, or alloys of the above-mentioned materials. Forming a top layer overlying the strike layer in Step 808 includes forming a top layer from a material such as refractory metals, refractory metal nitrides, or mixed nitride-silicides. As noted above, the base and top layers may be made from the same material, but it is not required.

In some aspects, selectively etching to remove the top layer overlying the substrate surface in Step 810 includes substeps. Step 810a conformally deposits a layer of photoresist (PR). Step 810b patterns the PR to expose the top layer overlying the substrate surface. Step 810c etches the exposed top layer.

The exposed top layer is etched (Step 810c) using an etchant such as hydrogen peroxide, mineral acids, alcoholic and aqueous iodine, bromine, chlorine, alkalis, aqueous ammonia, or mixtures of the above-mentioned etchants. The PR conformal deposition in Step 810a may further include a PR stabilization process such as baking or ultraviolet hardening.

Figure 9:
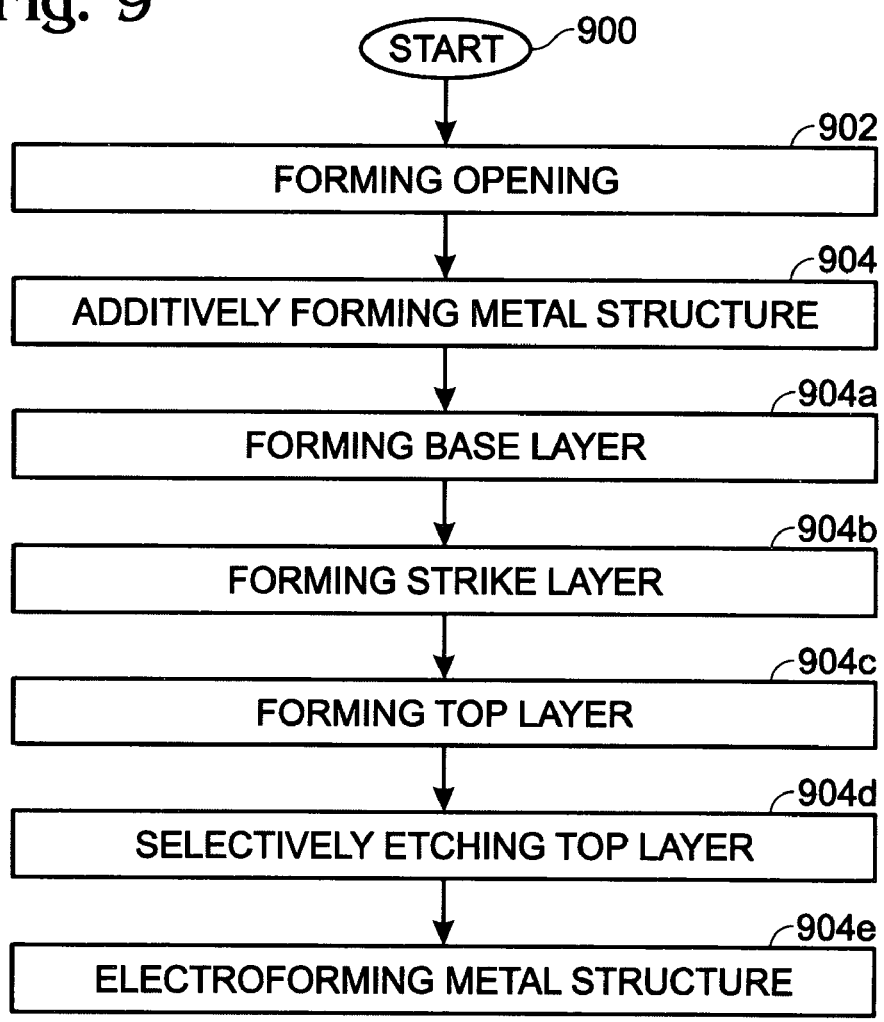
FIG. 9 is a flowchart illustrating the present invention method for additive metal deposition on integrated circuit substrates.

FIG. 9 is a flowchart illustrating the present invention method for additive metal deposition on integrated circuit substrates. The method starts at Step 900. Step 902 forms an opening through an interlevel insulator, exposing a substrate surface. Step 904 additively forms a metal structure in the opening. In some aspects, additively forming a metal structure in the opening includes substeps. Step 904a forms a base layer overlying the interlevel insulator and substrate surface. Step 904b forms a strike layer overlying the base layer. Step 904c forms a top layer overlying the strike layer. Step 904d selectively etches to remove the top layer overlying the substrate surface, exposing a strike layer surface. Step 904e electroforms a metal structure overlying the strike layer surface. For example, electroforming a metal structure overlying the strike layer surface may include depositing metal using either an electroplating or electroless deposition process.

An electroformed IC metal structure and associated deposition process have been provided. To clarify the invention, examples of materials and specific process steps have been given. However, the invention is not limited to merely these examples. Other variations and embodiments of the invention will occur to those skilled in the art.

We claim:

1. An electroformed metal structure, the structure comprising:
   a substrate with a surface;
   an interlevel insulator overlying the substrate, with an insulator top surface and an opening exposing the substrate surface;
   a base layer overlying the interlevel insulator, and including a first base layer region with a top surface formed below the level of the insulator top surface, and with a bottom surface overlying and in contact with the exposed substrate surface;
   a strike layer having a top surface formed below the level of the insulator ton surface and a bottom surface overlying the first base layer region top surface; and,
   an electroformed metal structure having a bottom surface below the level of the insulator too surface and overlying the strike layer surface top surface.

2. The structure of claim 1 wherein the metal structure is a metal selected from the group including Cu, Au, Ir, Ru, Rh, Pd, Os, Pt, and Ag.

3. The structure of claim 1 wherein the metal structure is a structure selected from the group including a line, via, bonding pad, electrode, contact hole, and interlevel interconnect.

4. The structure of claim 1 wherein the base layer is a material selected from the group including refractory metals such as W, Ta, Ti, Zr, Mo, Cr, refractory metal nitrides and carbides, mixed nitride-carbides, and mixed nitride-silicides.

5. The structure of claim 1 wherein the strike layer is a material selected from the group including Pd, Pt, Ir, Rh, Ru, Os, Ag, Au, Cu, Ni, Cr, and alloys of the above-mentioned materials.

6. The structure of claim 1 wherein the substrate is a material selected from the group including silicon, glass, ceramic, and plastic.

7. The structure of claim 1 further comprising:
   a temporary top layer, made from a material including refractory metals, refractory metal nitrides, and mixed nitride-silicides, overlying the strike layer.

\* \* \* \* \*